United States Patent [19]
Tung

[11] Patent Number: 5,037,505
[45] Date of Patent: Aug. 6, 1991

[54] CONSTRUCTION PROCESS FOR A SELF-ALIGNED TRANSISTOR

[75] Inventor: Pham N. Tung, Paris, France

[73] Assignee: Thomson Composants Microondes, Puteaux, France

[21] Appl. No.: 496,223

[22] Filed: Mar. 20, 1990

[30] Foreign Application Priority Data

Apr. 21, 1989 [FR] France ............... 89 05317

[51] Int. Cl.$^5$ .................... H01L 21/306; B44C 1/22; C03C 15/00; C03C 25/06
[52] U.S. Cl. ........................ 156/643; 156/646; 156/653; 156/657; 156/661.1; 156/662; 437/41; 357/23.9
[58] Field of Search ........... 156/643, 644, 646, 653, 156/657, 659.1, 661.1, 662; 437/41–45, 235, 238, 241, 228; 357/23.9, 40–41, 65–67

[56] References Cited

U.S. PATENT DOCUMENTS

| | | | |
|---|---|---|---|
| 4,472,872 | 9/1984 | Toyoda et al. | 437/41 X |
| 4,488,351 | 12/1984 | Momose | 431/41 |
| 4,577,392 | 3/1986 | Peterson | 156/643 X |
| 4,784,718 | 11/1988 | Mitani et al. | 437/41 X |

OTHER PUBLICATIONS

IBM Technical Disclosure Bulletin, vol. 25, No. 3A, Aug. 1982, New York, U.S., L. M. Ephrath et al.: "Self-Aligned Gate Process Using Pattern Transfer for High Speed MESFET Fabrication", pp. 1189–1193.

Journal fo the Electrochemical Society, vol. 133, No. 10, Oct. 1986, pp. 409C–416C, Manchester, NH, U.S.; C. E. Weitzel et al.: "A Review of GaAs MESFET Gate Electrode Fabrication Technologies".

Primary Examiner—William A. Powell
Attorney, Agent, or Firm—Oblon, Spivak, McClelland, Maier & Neustadt

[57] ABSTRACT

Disclosed is a device enabling a transistor of submicronic gate length to be constructed using optical means of masking. The process includes a stage during which a resin, deposited on a wafer of semiconducting materials, is etched in order to isolate a pattern as a future gate mask. The mask is eroded, and a layer of silica deposited. Because of the erosion, the sides of the pattern and of the mask are inclined. After etching of the layer of silica and the masking resin, there remain therefore two silica masks whose sloping sides leave a submicronic aperture, through which the gate is deposited.

5 Claims, 2 Drawing Sheets

CONSTRUCTION PROCESS FOR A SELF-ALIGNED TRANSISTOR

FIELD OF THE INVENTION

The present invention concerns a process for manufacturing a transistor by self-alignment of the gate and the source and drain metallisations. This process enables a gate length to be obtained which is less than the lower limit, or resolution, of the optical masking processes presently used. The improvement in the precision of the patterns produced is due to controlled deformation of one of the masking layers of resin, during the process.

BACKGROUND OF THE INVENTION

For microwave transistors, whether discrete or in integrated circuits, the gate length measured in the direction source-drain is critical, in the submicronic field. Optical masking equipment is the most common, and is suitable for mass production, but it cannot mask gates of smaller length than about 1 micron. To construct so-called submicronic transistors, electronic means of masking must be used, which are much more expensive and above all much slower, but enable gates 0.2 micron in length to be constructed.

SUMMARY OF THE INVENTION

The process according to the invention, which is intended for microwave transistors, enables gates of submitcronic lengths to be constructed using methods of optical masking, which are therefore no smaller than a micron. It is based on self-alignment techniques, well known in themselves, but uses a resin mask in which a short pattern, at the site of the future gate, is separated by two short intervals from the patterns masking the future source and drain. The vertical edges of these resin patterns are deformed by ionic or plasma etching, which gives them an oblique profile.

When a layer of silica is then deposited in the intervals and the resin patterns then dissolved, two small silica masks with oblique sides are left in the intervals: the aperture between these two small masks is less than 1 micron and it is through this aperture that the gate is deposited, thus making it submicronic.

The length of the aperture can be adjusted by the length of the central resin pattern and by the ion etching which is performed afterwards: the gate length is therefore adjustable.

More precisely, the invention concerns a process of constructing a self-aligned transistor, including, supported by a substrate and several semiconductor layers, three metallisations for gate, source and drain, which includes at least the following stages:
  deposit of a layer of resin on the semiconductor material, and masking by optical means with a view to isolating at least one pattern, at the site of the future gate, this pattern being of dimensions which are at the limit of the power of resolution of optical means of masking,
  etching of the sides of the pattern and the sides of the resin mask by ionic or plasma etching, in the presence of $O^+$ ions, which gives these sides an inclined profile,
  deposit of a layer of silica on the mask and the pattern,
  masking of the silica by a resin in the intervals between the pattern and the resin mask, and partial etching of the silica,. then dry etching of the two resin masks, leaving only two silica masks whose inclined sides leave a space between them of submicronic dimensions, through which is deposited the gate metallisation of the transistor.

BRIEF DESCRIPTION OF THE DRAWINGS

The invention will be better understood with the help of the following detailed description of two examples of application, together with the appended figures which represent.

In these figures, the scales have been locally modified when this improves the clarity.

DESCRIPTION OF THE PREFERRED EMBODIMENTS

The invention will be described using the example of a GaAs microwave transistor with a Schottky gate, but it can easily be transposed to heterojunction or silicon transistors: what is important is not the structure of the transistor but the process of forming the metallisation of the gate.

Figure 1:
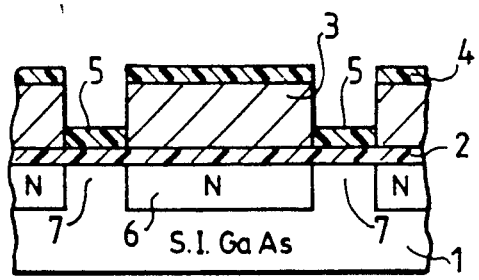
FIGS. 1 to 9: stages in the manufacture process of a transistor using implanted layers.

Several preliminary stages of the procedure are superimposed in FIG. 1 without detriment to the clarity of the explanation, since these stages are in themselves known.

On a substrate 1 of semi-insulating GaAs is deposited a layer of silicon nitride 2, then a first resin mask which includes at least one isolated pattern 3, corresponding to the transistor to be constructed. A deposit of silica 4 provides a mask 5, which surrounds the resin pattern 3. The first mask of resin is removed by dissolving, by the technique known as "lift off" Silicon is implanted to create at least one trench 6, with N-type conductivity. The transistor will be created in this trench, which is surrounded by an insulating wall 7 of semi-insulating GaAs. The silica mask 5 can be removed, and the N trench is annealed.

Figure 2:
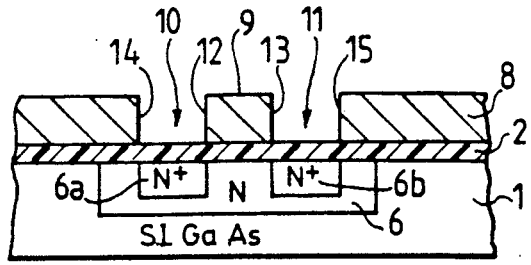

In FIG. 2, a second resin mask 8 is deposited on the silicon nitride. This mask is etched, centred with respect to the trench 6 in the substrate, so as to leave a pattern 9, at the site of the future transistor gate. This pattern 9 is separated from the rest of the mask 8 by two intervals 10 and 11, which have approximately the same dimensions. Typically, the pattern 9 is 1 micron long, and the intervals 10 and 11 are also each 1 micron long.

The pattern 9 has two sides 12 and 13, and the mask 8 has two sides 14 and 15 which delimit the intervals 10 and 11. All these sides, at this stage of the process, are perpendicular to the main plane of the substrate 1.

Implantation of silicon ions through the intervals 10 and 11 enables contacting trenches 6a and 6b to be created. This second implantation is performed using a higher concentration but lower energy than for the first implantation, so that the N+ trenches 6a and 6b are no deeper than the N trench 6.

Figure 3:
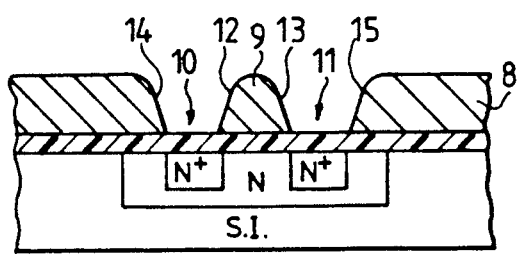

The originality of the process resides in the next operation, illustrated in FIG. 3. It consists in etching or deforming the pattern 9 and the sides of the resin mask 8, in order to reduce the length of the pattern 9, incline the sides, and round off the angles formed between the sides and the upper surface of the resin layer.

This etching can be done in two ways:

either by an O+ plasma, which shortens the pattern 9 and rounds off the angles, but without inclining the sides 12 to 15, or by dry etching using O+ ions, by the process known as RIE (reactive ion etching). This process is more advantageous for the following parts of the process, as it etches the sides 12 to 15 of the resin layer giving them an inclination, as shown in FIG. 3.

Figure 4:
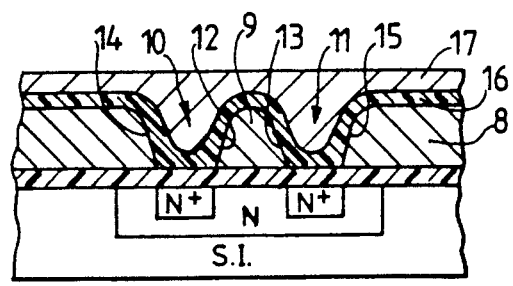

The resin mask 8 and its pattern 9, thus modified, serve as a support for a second silica layer 16, of uniform thickness, deposited by isotropic sputtering, as shown in FIG. 4. This layer takes the shape of the two intervals 10 and 11.

To isolate in this layer 16 the two small silica masks which will be used for the self-alignment, the external surface must first be made flat, with a third layer of resin 17: if the intervals 10 and 11 are open by only about 1 micron, the resin 17 fills them, as shown in FIG. 4. If the intervals 10 and measured more than 1 micron, the resin 17 would take the shape of the silica layer 16.

The two small silica masks are etched in the silica layer 16 by a two-part operation:

the resin layer 17 is removed, except for the thicker parts filling the intervals 10 and 11, by dry etching, using oxygen RIE or plasma, the silica layer 16 deposited on the resin 8 parallel to the main plane of the substrate is selectively etched by dry etching, using plasma or RIE in the presence of $CHF_3+C_3F_8$. The silica deposited on the sides 12 to 15, protected by the resin 17 which remains in the intervals 10 and 11, is not etched.

Figure 5:
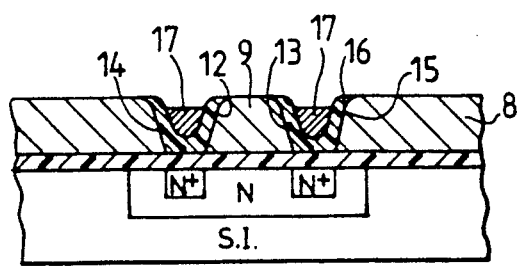

The result of this double dry etching is shown in FIG. 5: there remain only two V-shaped parts of the silica layer 16, which rest on the sloping sides 12 to 15 of the second layer of resin 8, but are filled by the remains of the third layer of resin 17.

Figure 6:
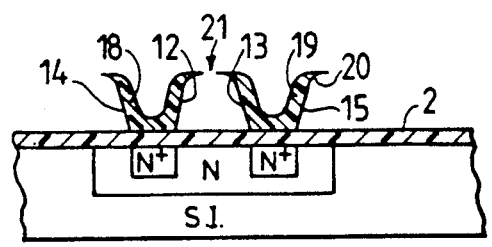

Another dry etching using Oxygen RIE or plasma clears the GaAs layer of the remains of resins 8 and 17: on FIG. 6 there remain only the two small silica masks, resting on the layer of silicon nitride 2. To simplify the following explanations, these silica masks will be referred to as 18 and 19. Since there is no resin left on the semiconducting material, the N+ trenches 6a and 6b are annealed at 850° C., for 20 minutes.

The V-shape of the said masks has already been mentioned. It should also be noticed that due to the ion etching which has been performed on the second mask 8 (FIG. 3), the sides 12 to 15 end in rounded parts 20, thus increasing the cast shadow effect which will be useful later.

It should be noted in particular that the size of the aperture 21 between the facing sides 12 and 13 of the masks 18 and 19 is adjustable. If the dry etching of the pattern 9 (FIG. 3) is slight, the resin pattern 9 has a mainly flat upper face, which later gives a relatively large aperture 21. If, on the other hand, the dry etching of the same pattern 9 is prolonged, it can give at the extreme limit a cone-shaped pattern, where there would be no aperture 21. The dimension of the aperture 21—and therefore the length of the gate of the future transistor—is thus adjusted by the dry etching of the resin pattern 9, and no longer depends on the sophistication of the masking material.

Before using the masks 18 and 19 to self-align a gate, the silicon nitride layer 2 must be opened. To do so, in FIG. 7, a fourth resin mask 22 is deposited on the wafer, then etched to clear the site of the future source and drain ohmic contacts. A pattern 23 of the resin layer 22 must remain to block the aperture 21 between the masks 18 and 19. The etching of this fourth resin mask does not require great precision at the site of the future source and drain metallisations, as long as these are in contact with the N trench 6, nor for the future gate, which will be defined by the aperture 21: the only requirement is that the plug 23 must block the aperture 21.

This mask having been made, the silicon nitride layer 2 is locally etched using known techniques, then the Au-Ge-Ni ohmic contacts 24 and 25 are deposited by sputtering, at the places where the silicon nitride layer 2 has been etched. During the sputtering, the metal is deposited in a layer 26, notably on the plug 23 and the edges of the masks 18 and 19.

The fourth resin mask 22 and 23 is then removed by liftoff, as is the metallisation 26 which was deposited on it. The aperture 21 is thus freed. The ohmic metallisations 24 and 25 are annealed at 440° C.

Figure 8:
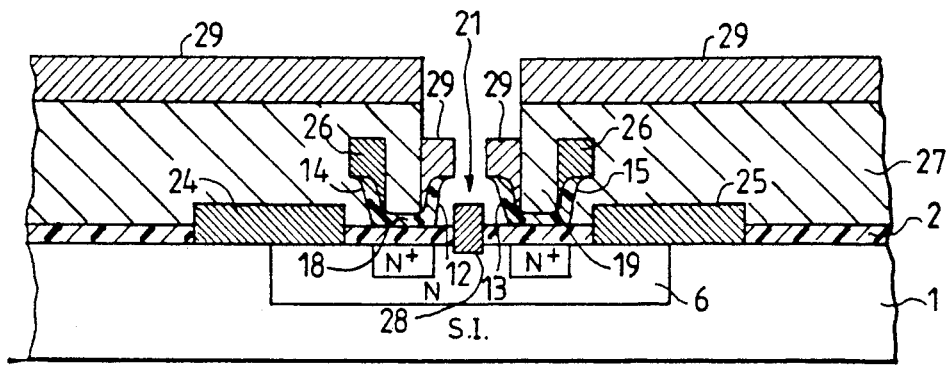

In FIG. 8, a fifth resin mask 27 is deposited, and then etched in such a way as to clear the aperture 21. Here again, the masking does not need to be very precise, since the aperture 21 is defined by the sides 12 and 13 of the silica masks 18 and 19. It is simply necessary that the etching of the fifth mask 27 should be between the outer sides 14 and 15 of the silica masks 18 and 19, with particular emphasis if necessary on any remains of the ohmic metallisation 26 not removed by lift-off.

Through the aperture 21, the silicon nitride layer 2 is etched by RIE in the presence of $CHF_3+C_3F_8$, at the site of the future gate. The etching is prolonged in order to create a slight depression in the material N of the trench 6, which enables the threshold voltage $V_T$ of the transistor to be adjusted.

The gate metallisation 28 is deposited via the aperture 21, using a directional method. The deposit of Ti-Pt-Au gives a Schottky contact. During this operation, the metals are also deposited in a layer 29 on the mask 27 and on the edges of the silica masks 18 and 19.

The fifth resin mask 27 and the metals deposited on its free surface are removed by lift-off, then the silica masks 18 and 19, topped by metals 26 and 29, are removed by dissolving in an aqueous solution of $HF+NH_4F$.

Figure 9:
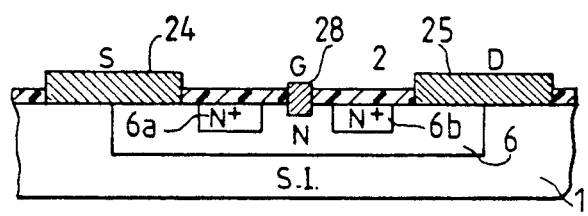

The finished transistor is shown in FIG. 9: its internal structure, in the layers of semiconducting materials, may be different from that chosen for description of the invention, and the materials may also be different, silicon, GaAlAs, etc., but it has the peculiarity of possessing self-aligned gate, source and drain metallisations, and a gate length smaller than the resolution of the optical masking equipment employed for the second mask 8 and 9.

Figure 10:
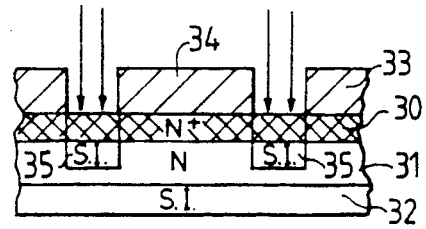
FIGS. 10 to 13: stages in the manufacture process of a transistor using layers formed by epitaxy.
Figure 13:
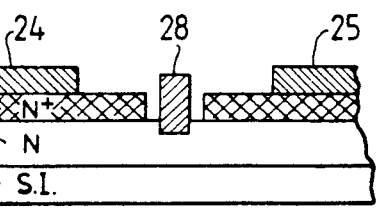

FIGS. 10 and 13 represent some stages of the process according to the invention if the starting wafer already has N and N+ layers formed by epitaxy. The other stages are the same as those already described.

In FIG. 10, a wafer of semiconducting material includes an N+ layer 30 formed by epitaxy on an N layer 31. A first resin mask 33 is etched to create a pattern 34, under which the transistor will be made. A bore implantation creates an insulating wall 35 of semi-insulating material, around the region masked by the pattern 34, which corresponds to the mask 8 and 9 in FIG. 2.

By comparison with the process already described:

there is no silicon nitride layer 2, there is no point in implanting the N+ trenches 6a and 6b since an N+ layer 30 already exists.

The rest of the operation is identical to that shown in FIGS. 2 (without silicon implantation), 3, 4, 5 and 6 to form the silica masks 18 and 19, but there is in total one mask less.

Figure 7:
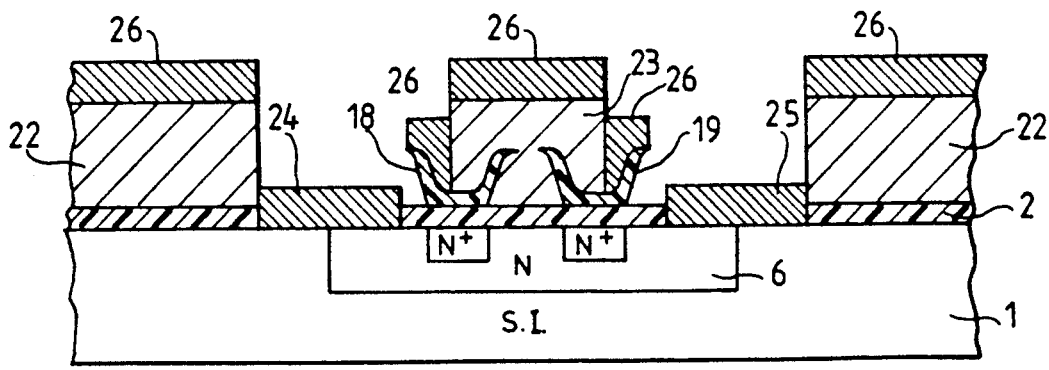
Figure 11:
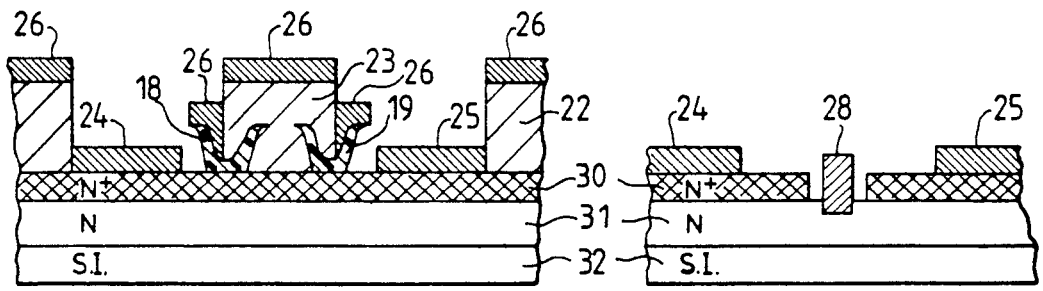

The first modification occurs when the source and drain metallisations 24 and 25 are deposited, as shown in FIG. 11 (in comparison with FIG. 7). Since there is no longer a silicon nitride layer 2, there is no point in etching it. After deposit and etching of the fourth resin mask 22 and 23 (the same reference numbers have been used as in FIGS. 1–9), the ohmic contacts 24 and 25 are deposited directly on the N+ layer 30.

Figure 12:
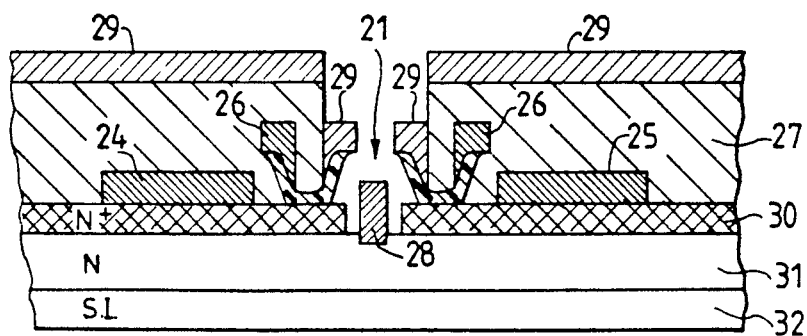

The second modification occurs on deposit of the gate metallisation 28: compare FIG. 12 with FIG. 8. The layer 30 of N+ type material is etched through the aperture 21, as is part of the N layer 31, so as to adjust the threshold tension $V_T$. Then the Schottky gate metallisation 28 is deposited as described above for FIG. 8.

Then the resin mask 27 and the metallic deposits 29 are dissolved, and finally the two silica masks 18 and 19 and the metallic deposits 26. The self-aligned transistor obtained by this variant process is shown in FIG. 13.

To sum up, the principle of the process according to the invention is based on the use of optical means of masking, which have the advantage of being more widespread and much faster than electronic means of masking, but are physically limited to a resolution of about 1 micron, and on the deformation of a resin mask 8 and 9, which enables two silica masks 18 and 19 to be obtained, separated by a distance smaller than the resolution power of the optical means of masking.

Of course, techniques other than those described for etching or depositing can be used by the technician, without leaving the domain of the invention which is defined by the following claims.

What is claimed is:

1. Process of constructing a self-aligned transistor, which is supported by a substrate and includes several layers of semiconducting material, and gate, source and drain metallisations, comprising the steps of:
   depositing a layer of resin on the semiconducting material,
   masking by optical means to isolate at least one pattern, at the site of the gate, the pattern being of dimensions which are at the limit of the resolution power of said optical means,
   etching the sides of the pattern and the sides of the resin mask by plasma or ion etching, in the presence of O+ ions, to give said sides a sloping profile,
   depositing a layer of silica on the mask and the pattern,
   masking the silica by a resin, between the pattern and the resin mask, and partial etching of the silica, then dry etching the two resin masks, leaving only two silica masks whose sloping sides leave between them an aperture of submicronic dimensions, through which is deposited the gate metallisation of the transistor.

2. Process of constructing a self-aligned transistor, according to claim 1, from a substrate of semi-insulating material, further comprising the steps of:
   a) depositing on the substrate a layer of silicon nitride, masking first with resin and then with silica, dissolving the resin and implanting silicon to create a trench of type N, and dissolving the silica mask,
   b) depositing and masking by a second resin mask, creating a resin pattern of dimensions corresponding to the resolution power of the optical means of masking used, and implanting silicon to create two N+ trenches on the N trench,
   c) etching the sides of the pattern and the sides of the second mask by oxygen plasma or oxygen ion etching, to shrink the resin pattern and incline the sides,
   d) depositing a layer of silica on the second mask, on the resin pattern and in the gaps which separate the pattern from the second mask, and depositing a third resin mask on the layer of silica,
   e) dry oxygen etching the third resin mask, leaving only the resin in the gaps between the pattern and the second mask, then dry etching by CH $F_3$+$C_3 F_8$ of the layer of silica, leaving only the two parts between the second and third resin masks,
   f) dry oxygen etching the resin masks and pattern, leaving two masks of silica whose sloping edges leave between them an aperture of dimensions smaller than the resolution power of said optical means,
   g) depositing a fourth resin mask, etching the silicon nitride layer at the side of the source and drain contacts, depositing the ohmic source and drain metallisations, and dissolving the fourth resin mask,
   h) depositing a fifth resin mask, dry etching by CH $F_3$+$C_3 F_8$ of the silicon nitride layer at the site of the gate contact, through the aperture between the two silica masks, depositing of the Schottky gate metallisation, and dissolving the fifth resin mask,
   i) dissolving the two silica masks in a solution of HF+$NH_4F$+$H_2O$.

3. Process of constructing a self-aligned transistor, according to claim 1, from a substrate comprising layers of type N and N+ formed by epitaxy, further comprising the steps of:
   a) depositing and masking by a first resin mask creating a resin pattern of dimensions corresponding to the power of resolution of said optical means,
   b) etching the sides of the pattern and the sides of the first mask by oxygen plasma or oxygen ion etching, to shrink the resin pattern and incline the sides,
   c) depositing a layer of silica on the first mask, on the resin pattern and in the gaps which separate the pattern from the second mask, and depositing a second resin mask on the layer of silica,
   d) dry oxygen etching of the second resin mask, leaving only the resin in the gaps between the pattern and the first mask, then dry etching by CH $F_3$+$C_3 F_8$ of the layer of silica, leaving only the two parts between the first and second resin masks,
   e) dry oxygen etching the resin masks and pattern, leaving two masks of silica whose sloping edges leave between them an aperture of dimensions smaller than the resolution power of said optical means,
   f) depositing a third resin mask, depositing the ohmic source and drain metallisations, and dissolving the third resin mask,
   g) depositing a fourth resin mask, dry etching by CH $F_3$+$C_3 F_8$ of the layer of N+ semiconducting material at the site of the gate contact, through the aperture between the two silica masks, deposit of the Schottky gate metallisation, and dissolving the fourth resin mask,
   h) dissolving the two silica masks in a solution of HF+$NH_4F$+$H_2O$.

4. Process of constructing a self-aligned transistor, according to claim 1, wherein the silica masks have sloping sides which are rounded at their free end, this rounding contributing to the diminution of the aperture through which the gate is self-aligned.

5. Process of construction of a self-aligned transistor, according to claim 1, wherein the length of the aperture is adjusted by plasma etching or oxygen dry etching of the resin pattern of the second mask.

* * * * *